(12) United States Patent
Andriessen

(10) Patent No.: US 6,724,141 B2
(45) Date of Patent: Apr. 20, 2004

(54) PARTICULAR TYPE OF A THIN LAYER INORGANIC LIGHT EMITTING DEVICE

(75) Inventor: Hieronymus Andriessen, Beerse (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/264,201

(22) Filed: Oct. 3, 2002

(65) Prior Publication Data

US 2003/0107313 A1 Jun. 12, 2003

Related U.S. Application Data

(60) Provisional application No. 60/333,225, filed on Nov. 21, 2001.

(30) Foreign Application Priority Data

Oct. 30, 2001 (EP) .............................................. 01000579

(51) Int. Cl.[7] ................................................. H01J 1/62
(52) U.S. Cl. ...................................... 313/506; 313/503
(58) Field of Search ................................ 313/498, 503, 313/506, 512

(56) References Cited

U.S. PATENT DOCUMENTS

| | | | |
|---|---|---|---|
| 4,751,427 A | * 6/1988 | Barrow et al. ............... | 313/503 |
| 5,349,596 A | 9/1994 | Molva et al. ................. | 372/43 |
| 5,416,337 A | 5/1995 | Chang et al. ................. | 257/13 |
| 5,602,445 A | 2/1997 | Solanki et al. .............. | 313/503 |
| 5,882,779 A | 3/1999 | Lawandy .................... | 428/323 |
| 5,917,279 A | 6/1999 | Elschner et al. ............ | 313/506 |
| 6,207,229 B1 | 3/2001 | Bawendi et al. ............ | 427/215 |

FOREIGN PATENT DOCUMENTS

| | | |
|---|---|---|
| EP | 0 622 439 | 11/1994 |
| EP | 0 911 887 | 4/1999 |
| WO | 99/50916 | 10/1999 |
| WO | 00/70917 | 11/2000 |

* cited by examiner

*Primary Examiner*—Vip Patel
(74) *Attorney, Agent, or Firm*—Joseph T. Guy; Nexsen Pruet, LLC

(57) ABSTRACT

A Thin Layer Inorganic Light Emitting device is disclosed comprising a substrate, a first electrode, a coated layer comprising substantially undoped zinc sulfide nanoparticles, and a second electrode. On applying a voltage between the two electrodes the device emits light with an emission maximum of electroluminescence at a wavelength above 450 nm.

18 Claims, 3 Drawing Sheets

PARTICULAR TYPE OF A THIN LAYER INORGANIC LIGHT EMITTING DEVICE

The application claims the priority of Provisional Application No. 60/333,225 filed Nov. 21, 2001.

FIELD OF THE INVENTION

The present invention relates to a particular type of the Inorganic Light Emitting Devices based on zinc sulfide.

BACKGROUND OF THE INVENTION

ZnS is a well-known phosphor material. It is used in many applications like after-glow phosphors, photon conversion phosphors and electroluminescent phosphors (Cathode Ray Tube displays, Field Emission Displays, Powder Electroluminescent devices, . . . ).

Back in 1928, Lenard[1] and his group found that incorporation of certain metal impurities such as Cu, Ag or Pb leads to luminescence characteristics of these ions. For this reason he called such an impurity an "activator". He also found that ZnS without these impurities can show blue luminescence if fired with alkali halide flux. This was called "self-activated" luminescence. It was later clarified that self-activated luminescence is actually activated by pairs of a halogen donor and a Zn-vacancy acceptor.

Clear explanation of the luminescence centers and the mechanism of optical transitions were established in 1960s [2].

In parallel with scientific advances, some discoveries and inventions motivated research of ZnS phosphors aimed for applications. Destriau[3] discovered electroluminescence from ZnS powder immersed in oil and sandwiched between metal plates, when applying electric voltage to the metal plates. In the early 1950s Sylvania announced a flat lamp using this phenomenon. Today, commercial ZnS-based phosphor powders formulated in pastes are available. These pastes, together with a suitable dielectric paste and conductor pastes, can be used in simple screen printing processes for producing flat lamps with almost unlimited geometric forms.

Later, Sharp cooperation[4] developed driven thin-film El panels, in which ZnS:$Mn^{2+}$ is sandwiched by insulator films. Since 1983 orange-emitting monochrome displays using ZnS:$Mn^{2+}$ films have been commercialized.

In color Cathode Ray Tube displays, first $Zn_2SiO_4$:$Mn^{2+}$ for green primary and $Zn_3(PO_4)_2$:$Mn^{2+}$ for red were used with blue-emitting ZnS:Ag[5]. Later the "all-sulfide screen" using ZnS-based materials for the three primaries were put on the market. Although in 1964 the red-emitting $YVO_4$:$Eu^{3+}$ was developed and later in 1968 $Y_2O_2S$:$Eu^{3+}$, which is the red phosphor presently used[6], ZnS phosphors have been always very important green and blue phosphors.

Semiconductor particles of several nm size show various interesting phenomena originated in the transitional nature from molecular to bulk properties. When the particle size becomes smaller than the diameter of a bulk exciton (e.g. about 6 nm in CdS and ca 4.4 nm in ZnS[7], the optical spectra will show size-dependent absorption thresholds instead of the constant bulk band gap. With decreasing particle size, the threshold shifts to higher photon energy. Such phenomena are called "quantum size effects" or "quantumconfinement".

Some examples of wet chemical preparations of ZnS nano-particles can be found in the following references[8].

Becker[9] observed a broad photoluminescence peak of colloidal ZnS around 428 nm which he assigned to transitions due to sulfur vacancies. After irradiation treatment, the peak shifted to 418 nm and this was attributed to transitions involving interstitial zinc or sulfur atoms. D. Denzler et al.[10] describes the photoluminescence behaviour of colloidal ZnS nanocrystals. In the UV-region a quadruple fine structure could be observed at wavelengths: 416, 424, 430 and 438 nm. In the visible region a weak band at 590 nm could be observed. However, this was attributed to $Mn^{2+}$ impurities. In the IR-region, two fine structured emission bands at 675 and 715 could be observed.

In pending patent applications different thin film electroluminescent devices and constructions are described. Apart from the well-described organic based emitting devices like PLEDs and OLEDs and the inorganic based emitting devices like PEL and TFEL, several research groups reported recently electroluminescence[11-15] from inorganic semiconducting nano particles.

Colvin et al.[11] reported on the electroluminescence of CdSe nano-particles stabilized by hexane dithiol. They demonstrated electroluminescence for two devices comprising a spincoated double layer of CdSe and PPV on ITO and covered it with an evaporated Mg electrode. Depending on the voltage they observed emission from the CdSe (lower voltages) or from the PPV (higher voltages).

Electroluminescence of CdSe quantum-dot/polymer composites was also reported by Dabbousi et al.[12]. They spincoated on ITO one single layer of CdSe nano-particles stabilized with trioctylphosphine oxide and mixed with a polymeric hole transporter (PVK) and an electrontransport species (an oxadiazole derivative of PVK, t-Bu-PBD). An aluminum electrode was subsequently evaporated. The system showed electroluminescence in reverse bias, and depending on the applied voltage the emission spectrum of the CdSe quantumdots or PVK was observed.

Gao et al.[13] reported on the electroluminescence of self-assembled films of PPV and CdSe nano-particles. They could observe electroluminescence from the CdSe particles and/or from the PPV, depending on the applied voltage.

These examples demonstrate the possible use of inorganic nano-particles with semiconductor properties as Light Emitting Diodes (ILED), in analogy with the OLEDs. However, the use of Cd- or Se-compounds can not be recommended due to environmental problems that can be expected.

Huang et al.[14] reported the photo- and electroluminescence of a single layer of ZnS:Cu nanocrystals spincoated on a ITO substrate and evaporated with an aluminum electrode. ZnS and $Cu_xS$ are much more environmental friendly compared to CdSe. Also there was no need for organic hole or electron transporters, which can cause stability problems as is known in the organic PELDs. The drawback of their system lies in the fact that the synthesis of the ZnS:Cu particles is quite cumbersome and results in low yields. Polystyrene sulphonic acid is used as polyelectrolyte on which Zn and Cu ions are attached. Subsequently this polyelectrolyte is solved in dimethylformamide and reacted with $H_2S$. By this way ZnS:$C_xS$ particles are formed.

Que et al.[15] reported photo- and electroluminescence from a copper doped ZnS nanocrystals/polymer composite. The synthesis of the nano-particles was carried out by using the inverse microemulsion method. After washing and drying the ZnS:Cu powder was redispersed in methylethylketone (MEK) with polymethylmethacrylate (PMMA) as a binder and spincoated on ITO and evaporated with an aluminum electrode. Green electroluminescence could be observed in both bias directions at 5 V. The drawback of the fabrication of this device is the low concentrations of the ZnS:Cu dispersion that can be obtained (ca $10^{-3}$ M). Further it needs a well defined two phase system (soap/water). Also a drawback could be the solvent based spincoating dispersion.

Leeb et al.[16] describes the electroluminescence of ZnS:Mn nano-particles. The device could be made more stable by adding $ZnI_2$.

In pending patent applications[8e] ILEDS are described which make use of doped ZnS nanoparticles.

All ILED examples mentioned above use photoluminescent nano-particles: or they are photoluminescent due to their quantumconfinement (like CdS, CdSe) or they are photoluminescent due to their doping (like $ZnS:Mn^{2+}$, $ZnS:Cu^+$, $ZnS:Cu^{2+}$). In both cases, however their emission bands are quite broad, all photoluminescence and hence all electroluminescence results in colored emission, i.e. no white emission is observed. The only way to produce white electroluminescent light is to combine different emitting particles or to use luminescent dyes in order to broaden the emission band.

A similar strategy was developed for PLEDs: mixing of different emitting polymers can result in white emitting PLEDs. In full-color displays, the summation of the three emission bands of the three basic colors, which are pixelated in this case, creates a white pixel, i.e. white emission.

However, due to the differences found in the operating lifetimes of the emitting polymers, the white color will not be stable due to the faster decay of one of the emitting polymers: the emitted light will become colored. This is also the main reason why full-color OLED or PLED displays are not yet commercial available.

A stable white emitting thin film device could be used as backlight in a full-color LCD device. If pixelated, the use of a color filter, also used in emitting LCD applications, will allow to construct a very simple straigthforeward full-color display without the drawbacks mentioned above.

References Cited:

(1) P. Lenard, F. Schmidt and R. Tomaschek, *Handbuch der Experimantalphysik*, Akademische Verlagsgesellschaft, Leipzig, 1928, p. 397.

(2) S. Shionoya In: "*Luminescence of Inorganic Solids*", (Ed. P. Goldberg, Academic Press), 1966, pp. 205

(3) G. Destriau, *J. Chim. Phys.* (France), 1936, 33, 587

(4) T. Inoguchi, M. Takeda, Y. Kakihara, Y. Nakata and M. Yoshida, SID'74, 1974, Digest 84.

(5) H. Yamamoto, Lumin. Relat. Prop. II-VI Semicond., 1998, 169–207, ed. Vij D. R. Singh N., Publisher: Nova Science Publ. Zinc Sulphide.

(6) M. R. Royce and A. L. Smith, 1968, rare earth Oxysulfides—A new family of phosphor hosts for rare earth activators, Electrochem. Soc., spring Meeting, Abstract No. 34.

(7) K. H. Hellwege, O. Madelung, M. Schult and H. Weiss, Landolt-Borstein, *Semiconductors* (Springer, Berlin, 1983), Vol. 17

(8) (a) R. Rossetti, R. Hull, J. M. Gibson and L. E. Brus, *J. Chem. Phys.,* 1985, 82, 552; (b) H. Weller, U. Koch, M. Gutiérrez and A. Henglein, *Ber. Bunsenges. Phys. Chem.* 1984, 88, 649–656; (c) J. G. Brennan, T. Siegrist, P. J. Carroll, S. Stuczynski, P. Reynders, L. E. Brus and M. L. Steigerwald, *Chem. Mater.* 1990, 2, 403;(d) R. N. Bhargava, D. Gallagher, X. Hong and A. Nurmikko, *Phys. Rev. Lett.,* 1994, 72, 416; (e) European patent applications, Appl. Nos. 01000005, 01000006, 01000007, 01000008, 01000009, 01000010.

(9) W. G. Becker and A. J. Bard, *J. Phys. Chem.* 1983, 87, 4888

(10) D. Denzler, M. Olschewski and K. Sattler, *J. Appl. Phys.,* 1998, 84, 2841–2845

(11) Colvin V. L., Schlamp M. C. & Alivisatos A. P., *Nature*, 1994, 370, 354–357.

(12) Dabbousi B. O., Bawendi M. G., Onitska O. and Rubner M. F., *Appl. Phys. Lett.* 1995, 66 (11), 1316–1318

(13) Gao M., Richter B., Kirstein S. and Möhwald H., *J. Phys. Chem. B* 1998, 102, 4096–4103

(14) Huang J., Yang Y., Xue S., Yang B., Liu S., Shen *J. Appl. Phys. Lett.* 1997, 70(18), 2335–2337

(15) Que, Wenxiu; Zhou, Y.; Lam, Y. L.; Chan, Y. C.; Kam, C. H.; Liu, B.; Gan, L. M.; Chew, C. H.; Xu, G. Q.; Chua, S. J.; Xu, S. J.; Mendis, F. V. C.; *Appl. Phys. Lett.* 1998, 73(19), 2727–2729.

(16) J. Leeb, V. Gebhardt, G. Mueller, D. Haarer, D. Su, M. Giersig; G. McMahon, L. Spanhel, *J. Phys. Chem. B,* 1999, 103(37), 7839–7845.

OBJECTS OF THE INVENTION

It is an object of the present invention to provide a Thin Layer Inorganic Light Emitting Device based on zinc sulfide, which is easy to manufacture.

It is a further object of the invention to provide a Thin Layer Inorganic Light Emitting Device based on zinc sulfide which is capable of emitting light with an emission wavelength above 450 nm, preferably stable white light.

It is still a further object of the present invention to provide a Thin Layer Inorganic Light Emitting Device based on zinc sulfide which can be used as backlight in a full-color LCD device.

SUMMARY OF THE INVENTION

The objects of the present invention are realized by providing a Thin Layer Inorganic Light Emitting Device comprising, in order,
a transparent or semi-transparent substrate,
a first electrode,
a coated layer comprising zinc sulfide nanoparticles,
a second electrode, with the proviso that at least one of said first and second electrodes is semi-transparent,
characterized in, that (a) said zinc sulfide nanoparticles substantially contain no metal impurities, and (b) the device is capable of emitting light in response to a direct current caused by applying a voltage between said first and second electrode, with an emission maximum of electroluminescence at a wavelength above 450 nm.

In a preferred embodiment the emission maximum is in the visible spectral region.

BRIEF DESCRIPTION OF THE DRAWINGS

FIG. 3: illustrates the construction of a typical device according to the invention.

DETAILED DESCRIPTION OF THE INVENTION

Figure 1:
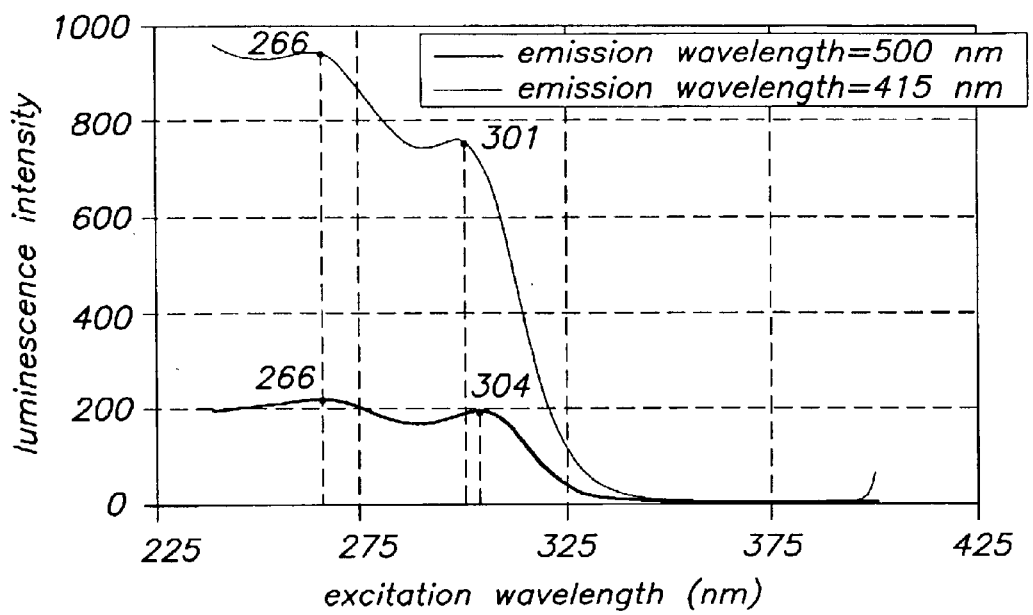
FIG. 1: excitation spectra of dispersion 2 (see example section) recorded at emission wavelengths 415 and 500 nm.

It is essential to the present invention that the zinc sulfide nanoparticles, used in the coated layer as described above, contain substantially no metal impurities, in other words the zinc sulfide is undoped. Substantially free means less than 500 ppm metal cations, or even less than 100 ppm metal cations versus ZnS. The average particle size is at most 100 nm, preferaby at most 50 nm, and most preferably at most 10 nm.

A dispersion containing undoped zinc sulfide nanoparticles is preferably prepared by a precipitation reaction whereby appropriate aqueous solutions containing zinc(II) ions on the one hand and sulfide ions on the other hand are mixed together. In a preferred embodiment the precipitation of the undoped ZnS particles is performed according to the double jet principle. In this technique a first and a second aqueous solution are added simultaneously to a third solution under controlled circumstances of temperature and flow rate. For instance, the first solution contains the zinc ions and the second solution contains the sulfide ions. A useful zinc salt is zinc acetate. A useful sulfide is sodium sulfide. The third solution may contain a water-soluble salt such as sodium chloride.

In a particularly preferred embodiment the precipitation of the zinc sulfide nanoparticles occurs in the presence of a triazole or diazole compound. In principle this triazole or diazole compound may be added to any of the aqueous solutions involved in the precipitation, or it can be divided between the different solutions. However, most preferably, the triazole or diazole compound is incorporated into the third solution.

Preferred triazole compounds are triazolo-pyrimidine compounds. A preferred triazolo-pyrimidine compound is compound is 5-methyl-1,2,4-triazolo-(1,5-a)-pyrimidine-7-ol, with following chemical formula:

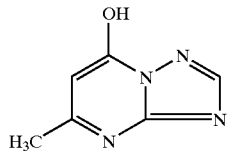

The use of diazoles and triazoles enables a better control on particle size (growth inhibitor), particle size distribution and dispersion homogenity. However, the exact working mechanism of the product during synthesis of the nanoparticles is not yet completely understood. As will be illustrated furtheron, ILEDs incorporating a coated layer containing ZnS nanoparticles precipitated in the presence of 5-methyl-1,2,4-triazolo-(1,5-a)-pyrimidine-7-ol show a better neutral white electroluminescence spectrum.

The resulting nanoparticle dispersion, or predispersion as it will be called in the examples, has to be washed and optionally concentrated. This is preferably done by an ultrafiltration and/or diafiltration treatment. The diafiltration is preferably performed in the presence of a stabilizing compound capable of preventing agglomeration of nanoparticles. The nature of this stabilizing compound is not restricted to a particular chemical class but can be chosen from various chemical types. Preferred compounds are polyphosphoric acid or a polyphosphate such as sodium polyphosphate, a hexametaphosphate such as sodium hexametaphosphate, and thioglycerol. Apart from in the diafiltration liquid the stabilizing compound may be added at any stage of the preparation, e.g. in one of the solutions used in the precipitation.

In a next step a surfactant may be added to the concentrated dispersion. Any of the numerous known surfactants can be used but a preferred product is a commercial saponine.

In order to prepare the dispersion for coating a binder is usually added. Preferred binders are aqueous solutions of polyvinyl alcohol (PVA), polyvinyl pyrrolidone (PVP). Adding of these binders improves the stability of the nanoparticle dispersions.

The Thin Layer Inorganic Light Emitting Device according to the present invention comprises, in order,
a transparent or semi-transparent substrate,
a first electrode,
a coated layer comprising zinc sulfide nanoparticles,
a second electrode, with the proviso that at least one of said first and second electrodes is semi-transparent,
characterized in, that (a) said zinc sulfide nanoparticles substantially contain no metal impurities, and (b) the device is capable of emitting light in response to a direct current caused by applying a voltage between said first and second electrode, with an emission maximum of electroluminescence at a wavelength above 450 nm.

In a preferred embodiment the emission maximum is in the visible spectral region.

We will firstly explain the two electrodes. In a preferred embodiment the two electrodes differ in their so-called work-function.

The application of electroactive organic and/or inorganic materials in devices (light emitting diodes, photovoltaic cells) often requires electrodes with a difference in their respective work functions. The work function of a metal is defined as minus the energy of an electron in the Fermi level of the compact metal. The difference in work function of the electrodes creates an electric field which generally facilitates charge injection in the case of light emitting devices or charge drain off in the case of photovoltaic devices. Usually Indium Tin Oxide (ITO) is used as transparent electrode having a work-function of 4.8–4.4 eV. The high work function enables the transport of positive charges (holes). An alternative for ITO is the high conductive PEDOT/PSS coatings (ORGACON™, a trade mark of Agfa-Gevaert N. V.). It possesses a work function of about 5 eV and it has proven to be a valuable alternative to the ITO electrode. The ITO or PEDOT/PSS electrode is commonly used in combination with low work function metal electrodes (second conductive electrode) like Al (3–4.2 eV), Mg (2.7–3.6 eV), Ca (2.2–3.3 eV) or other alkali earth metals. For the ease of handling, Al electrodes, applied by evaporation in vacuo, are preferred. These metal electrodes enable the injection of negative charges (electrons).

In a preferred embodiment there is a so-called hole injecting layer incoporated between the first electrode and the ZnS layer. In PLED or OLED devices hole injecting layers are often applied between the ITO electrode and the electroluminescent layer. For PLEDS, PEDOT/PSS is often used. It seems that this additional layer enhances the lifetime of the devices and decreases the threshhold voltage. These beneficial effects are explained by the fact that PEDOT/PSS smoothens the ITO surface by which the number of hot spots in the operating device decreases and the work function of PEDOT/PSS is about 5.2 eV, which is 0.4 eV higher than ITO (4.8 eV) resulting in a lower barrier for hole injection and finally leading to a lower threshhold voltage. Although the argument of smoothening the ITO surface seems to be valid in some cases, another reason for improving the lifetime can be found in the effect of PSS. This compound is anionic and will therefore limit the passage of electrons by its negatively charged shielding. Electrons which will enter the ITO will recombine with the positive charges present in the ITO due to the applied bias. Because the recombination energy cannot be converted to luminescence, the energy will be converted in heat, thereby destroying the ITO electrode. Hence the lifetime of the device will be limited. It can be shown that by applying a very thin PSS layer between ITO and the electroluminescent layer holes can still be injected in the electroluminescent layer but electrons are inhibited to enter the ITO electrode. This results in a better lifetime of the devices because recombination in the ITO electrode has been decreased.

The transparent or semi-transparent substrate is preferably an organic resin substrate, e.g. a polyester such as polyethylene terephthalate, or a glass substrate.

The zinc sulfide nanoparticles containing substatially no metal impurities and coated in a layer between the two conductive electrodes is preferably prepared by precipitation from aqueous solutions as explained extensively above, but, in principle, other preparation techniques can be used.

The dispersion to be coated can be applied on top of the first electrode by any suitable coating technique. For the manufacturing of a small prototype spincoating is mostly preferred, but for larger areas doctor blade coating or continuous coating techniques such as used in photographic emulsion coating like air knife coating, slide hopper coating, or curtain coating can be used. The obtained thickness of the dispersion layer is dependent from the nature and concentration of the binder, and from the coating conditions. This thickness is preferably between 10 and 500 nm, most preferably between 25 and 250 nm.

By applying a voltage between first and second electrode the device is capable of emitting light. The voltage bias is usually choosen as to allow for hole injection from the ITO side and electron injection from the metal contact side. The injected holes and electrons recombine in the ZnS layer. At present it is not clear if recombination directly yields electroluminescence (direct electroluminescence) or if the recombination energy is transferred to a luminescent centre (indirect electroluminescence). Because the electroluminescence spectrum of the undoped ZnS particles is broad it can be expected that many different recombination centres and/or luminescence centres exist in the system.

The present invention will now be illustrated by the following examples without however being limited thereto.

EXAMPLES

Preparation of the ZnS Dispersion 1

The following solutions were prepared:

| Solution 1 | |
| --- | --- |
| Zn $(AC)_2 \cdot 2H_2O$ | 131.7 g |
| DW | to 600 ml |

| -continued | |
| --- | --- |
| Solution 2 | |
| $Na_2S \cdot 9H_2O$ | 113.6 g |
| $NH_3$ (50%) | 5 ml |
| DW | to 600 ml |
| Solution 3 | |
| DW | to 1000 ml |
| NaCl | 58.44 g |

The ZnS dispersion was prepared as follows:

To solution 3, held at room temperature and stirred at 1500 rpm, solutions 1 and 2 were added simultaneously both at room temperature at a flow rate of 500 ml/min.

To 1000 ml of the resulting dispersion, 1000 ml of a 1% polyphosphoric acid solution was added and the dispersion was concentrated to 1000 ml by means of a Fresenius F60 cartridge. This dispersion was subsequently diafiltrated by using 5500 ml of a 1% solution of polyphosphoric acid solution in water. The dispersion was further concentrated to a volume of about 570 ml. This is dispersion 1.

Preparation of ZnS Dispersion 2

The following solution was prepared:

| Solution 4 | |
| --- | --- |
| TRI* | 40 g |
| DW | to 1000 ml |
| NaCl | 58.44 g |

*TRI = (5-methyl-1,2,4-triazolo-(1,5-a)-pyrimidine-7-o1)

The ZnS dispersion was prepared as follows:

To solution 4, held at room temperature and stirred at 1500 rpm, solutions 1 and 2 were added simultaneously both at room temperature at a flow rate of 500 ml/min.

To 1000 ml of the resulting dispersion, 1000 ml of a 1% polyphosphoric acid solution was added and the dispersion was concentrated to 1000 ml by means of a Fresenius F60 cartridge. This dispersion was subsequently diafiltrated by using 5500 ml of a 1% solution of polyphosphoric acid solution in water. The dispersion was further concentrated to a volume of about 570 ml. This is dispersion 2.

Excitation and Emissionspectra

Figure 2:
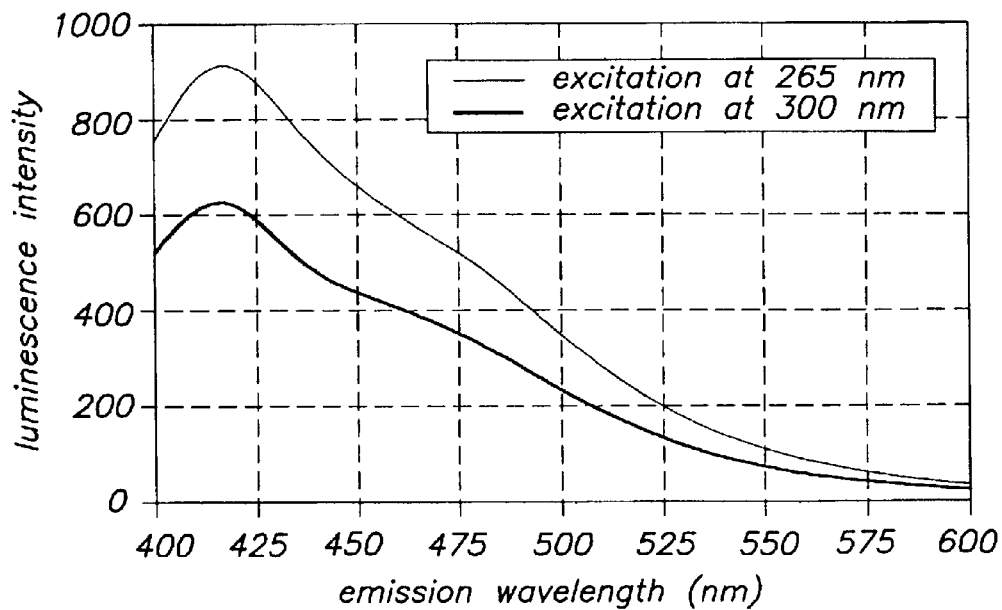
FIG. 2: emission spectra of dispersion 2 recorded at excitation wavelengths 265 nm and 300 nm.

FIG. 1 shows the excitation spectra for dispersion 2 diluted with water (1/200) at emission wavelengths 500 and 415 nm. It clearly shows two excitation maxima: one at 266 nm and another at 301–304 nm. FIG. 2 shows the emission spectra recorded at 265 and 300 nm excitation for dispersion 2 diluted with water (1/200). The emission around 415–425 nm can be explained by references 9 and 10 (background section). The broad and weaker emission band around 475 nm cannot yet be explained.

Preparation of the ILED Devices

To 20 ml of each dispersion 1 and 2, 1 ml of a 12.5% solution of Saponine Quillaya (Schmittmann) in water/ethanol (80/20) solution per 19 ml dispersion was added. To 16.4 ml of each of these dispersions 3.6 ml of a 5% polyvinylpyrrolidon (LUVISKOL K-90; trade mark of BASF AG) was added. These are called coating dispersions 1 and 2 respectively.

Figure 3A:
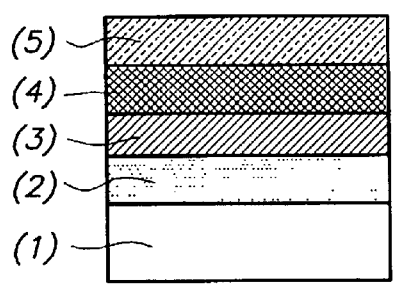
FIG. 3a represents the layer arrangement before patterning. It comprises a PET substrate (1), a conductive ITO layer (2), a hole injecting BAYTRON P EL layer (3), a zinc sulfide layer (4), a second electrode layer of evaporated aluminium (5).
Figure 3E:
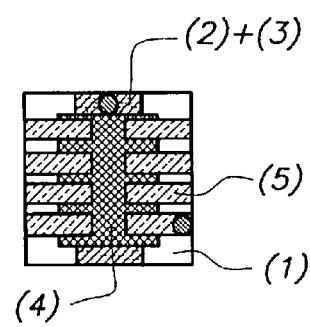
FIG. 3e represents a top view of the complete patterned device. (11) represents a direct current-voltage source (I/V source) connected to the ITO electrode and the aluminium electrode via contact points (12) and (13).
Figures 3B, 3C, 3D:
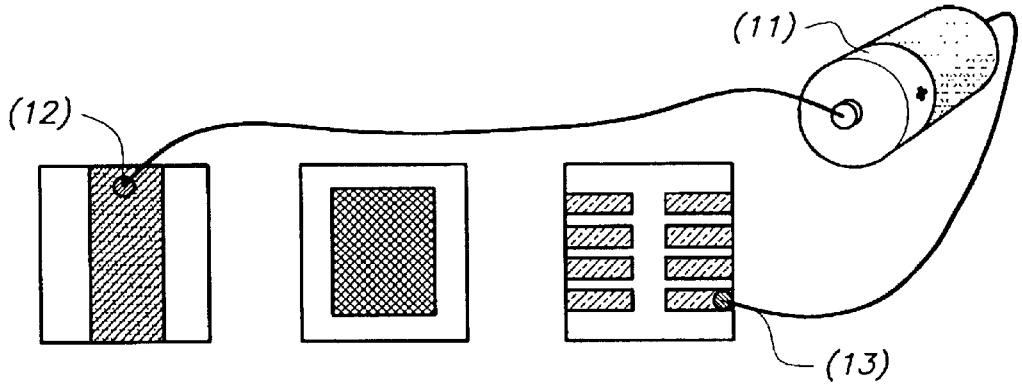
FIGS. 3b, 3c and 3d separately represent the patterning of the layers (2)+(3), (4), and (5) repectively.

Two samples of ITO on a PET substrate (175 μm) with a surface conductivity of about 80 Ohm/Sq were patterned using $HNO_3$. Two borders of about 1.5 cm were treated with $HNO_3$ in order to destroy the conductivity. The resulting materials comprise a conductive area in the middle of the material with dimensions 5 cm×2 cm. On top of this ITO, a Baytron P EL (Bayer AG) hole injecting layer was spincoated. The dry layer thickness was about 50 nm. Subsequently the coating ZnS dispersions were spincoated on these substrates twice at 1000 rpm in order to yield a thickness of the nano particle layer around 100 nm. Subsequently, a 160 nm thick aluminum electrode (cathode) was vacuum deposited on the spincoated double layers at $10^{-6}$ Torr by a mask. The emission area was 25 mm². The device construction is represented in FIG. 3.

Figure 4:
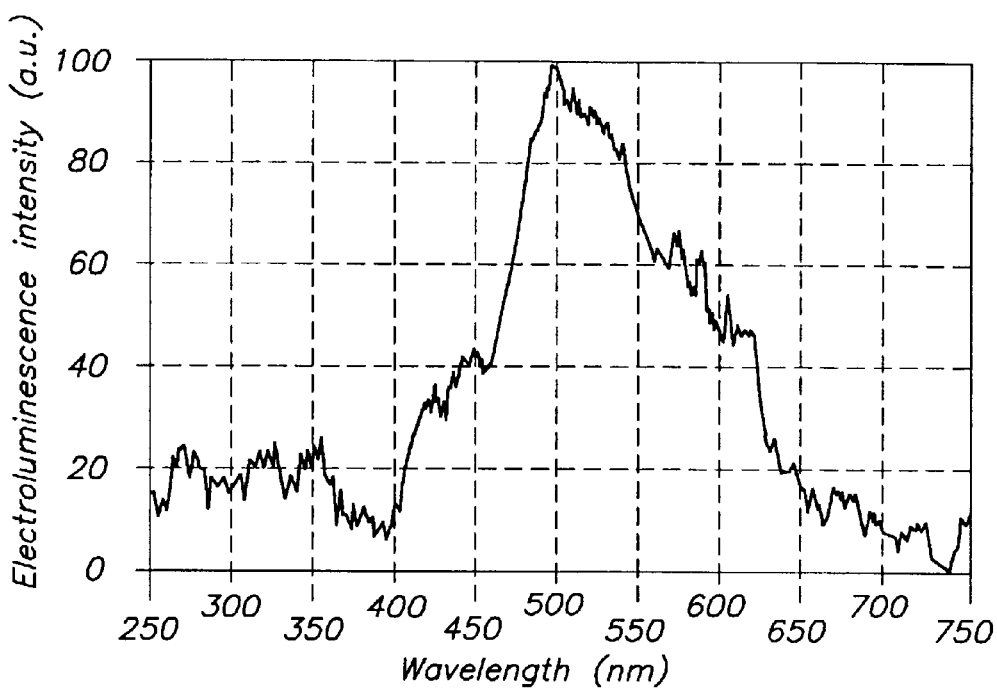
FIG. 4: electroluminescence spectrum of the device containing dispersion 1 (see example section).
Figure 5:
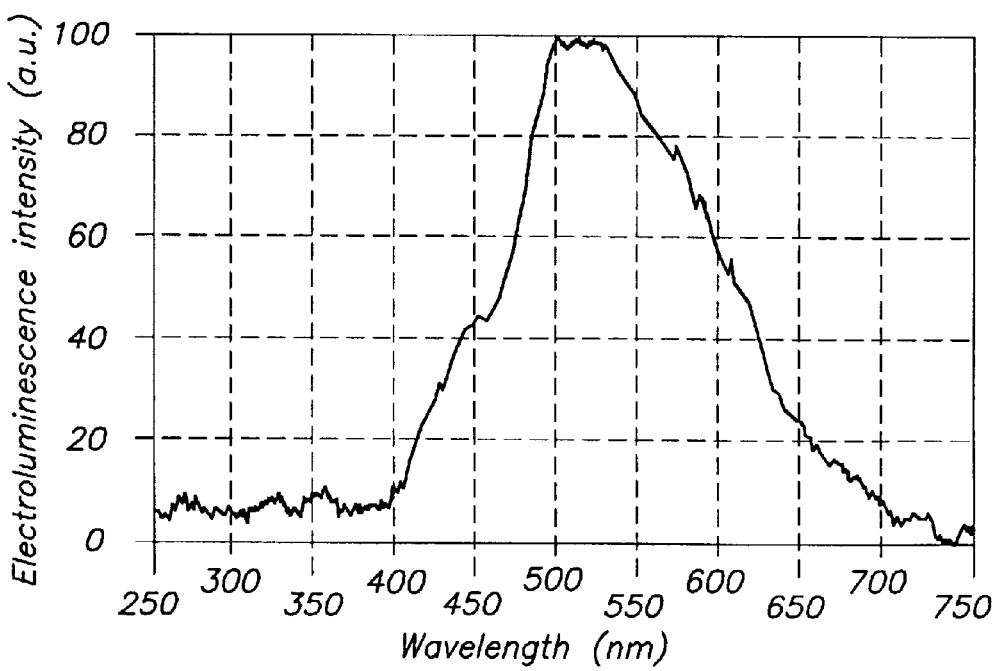
FIG. 5: electroluminescence spectrum of the device containing dispersion 2 (see example section).

FIGS. 4 and 5 show the electroluminescence spectra of these devices at a forward direct current bias voltage of 6 V. The current densities are about 4 mA/cm². As can be seen from the broad EL-spectra, dispersion 1 results in white electroluminescence light with a shade of blue whereas dispersion 2 results in white electroluminescence.

If FIG. 5 is compared to the photoluminescence spectra of FIG. 1 (dispersion 2) it becomes immediatly clear that electroluminescence occurs from different recombination sites which was not expected.

What is claimed is:

1. A Thin Layer Inorganic Light Emitting Device comprising, in order,
   a transparent or semi-transparent substrate,
   a first electrode,
   a coated layer comprising zinc sulfide nanoparticles,
   a second electrode, with the proviso that at least one of said first and second electrodes is semi-transparent,
   characterized in, that (a) said zinc sulfide nanoparticles substantially contain no metal impurities, and (b) the device is capable of emitting light in response to a direct current caused by applying a voltage between said first and second electrode, with an emission maximum of electroluminescence at a wavelength above 450 nm.

2. A Thin Layer Inorganic Light Emitting Device according to claim 1 wherein said wavelength larger than 450 nm is situated in the visible spectral region.

3. A Thin Layer Inorganic Light Emitting Device according to claim 1 or 2 wherein said said first and second electrodes have a different work function.

4. A Thin Layer Inorganic Light Emitting Device according to claim 1 wherein the average particle size of said zinc sulfide nanoparticles is smaller than 50 nm.

5. A Thin Layer Inorganic Light Emitting Device according to claim 4 wherein the average particle size of said zinc sulfide nanoparticles is smaller than 10 nm.

6. A Thin Layer Inorganic Light Emitting Device according to claim 1 wherein the thickness of the coated layer comprising zinc sulfide nanoparticles is between 10 and 500 nm.

7. A Thin Layer Inorganic Light Emitting Device according to claim 6 wherein the thickness of the coated layer comprising zinc sulfide nanoparticles is between 25 and 250 nm.

8. A Thin Layer Inorganic Light Emitting Device according to claim 1 wherein said zinc sulfide nanoparticles, containing substantially no metal impurites, are prepared by precipitation, performed by mixing appropriate aqueous solutions of zinc ions and sulfide ions respectively, followed by a washing step.

9. A Thin Layer Inorganic Light Emitting Device according to claim 8 wherein said precipitation is performed according to the double jet principle whereby a first aqueous solution of zinc ions and a second aqueous solution of sulfide ions are added together to a third solution under controlled conditions of temperature and flow rate.

10. A Thin Layer Inorganic Light Emitting Device according to claim 8 or 9 wherein one of said aqueous solutions contains a triazole or diazole compound.

11. A Thin Layer Inorganic Light Emitting Device according to claim 10 wherein said triazole compound is 5-methyl-1,2,4-triazolo-(1,5-a)-pyrimidine-7-ol.

12. A Thin Layer Inorganic Light Emitting Device according to claim 1 wherein said zinc sulfide nanoparticles are stabilized by a compound capable of preventing agglomeration of the nanoparticles, added at any stage of the preparation.

13. A Thin Layer Inorganic Light Emitting Device according to claim 12 wherein said stabilizing compound is chosen from the group consisting of a polyphosphate, polyphosphoric acid, a hexametaphosphate or thiogycerol.

14. A Thin Layer Inorganic Light Emitting Device according to claim 1 wherein said first conductive electrode is an Indium Tin Oxide (ITO) layer.

15. A Thin Layer Inorganic Light Emitting Device according to claim 1 wherein said first conductive electrode consists essentially of a poly(3,4-ethylenedioxythiophene)/polystyrene sulphonate complex.

16. A Thin Layer Inorganic Light Emitting Device according to claim 1 wherein said second electrode is an aluminum electrode applied by vacuum deposition.

17. A Thin Layer Inorganic Light Emitting Device according to claim 1 wherein said device comprises an additional layer, being a hole injecting layer, positioned between said first electrode, functioning as anode, and said zinc sulfide layer.

18. A Thin Layer Inorganic Light Emitting Device according to claim 17 wherein said hole injecting layer consists essentially of a coated poly(3,4-ethylenedioxythiophene)/polystyrene sulphonate complex.

* * * * *